(12) United States Patent
Ku et al.

(10) Patent No.: US 7,642,800 B2
(45) Date of Patent: Jan. 5, 2010

(54) WAFER TEST SYSTEM WHEREIN PERIOD OF HIGH VOLTAGE STRESS TEST OF ONE CHIP OVERLAPS PERIOD OF FUNCTION TEST OF OTHER CHIP

(75) Inventors: Tzong-Yau Ku, Tainan County (TW); Chien-Ru Chen, Tainan County (TW); Chin-Tien Chang, Tainan County (TW); Ying-Lieh Chen, Tainan County (TW); Lin-Kai Bu, Tainan County (TW)

(73) Assignee: Himax Technologies Limited, Tainan County (TW)

( * ) Notice: Subject to any disclaimer, the term of this patent is extended or adjusted under 35 U.S.C. 154(b) by 101 days.

(21) Appl. No.: 11/848,954

(22) Filed: Aug. 31, 2007

(65) Prior Publication Data

US 2009/0058438 A1      Mar. 5, 2009

(51) Int. Cl.
*G01R 31/02*    (2006.01)
*G01R 31/26*    (2006.01)

(52) U.S. Cl. .......... 324/765; 324/760; 324/754
(58) Field of Classification Search .......... None
See application file for complete search history.

(56) References Cited

U.S. PATENT DOCUMENTS

| | | | | |
|---|---|---|---|---|
| 6,323,639 | B1* | 11/2001 | Park | 324/158.1 |
| 6,372,528 | B1* | 4/2002 | Yamamoto | 438/15 |
| 6,731,127 | B2* | 5/2004 | Watts | 324/765 |
| 6,897,670 | B2* | 5/2005 | Burns | 324/758 |

* cited by examiner

*Primary Examiner*—Paresh Patel
(74) *Attorney, Agent, or Firm*—J.C. Patents

(57) ABSTRACT

A wafer, a test system thereof, a test method thereof and a test device thereof are provided. The present invention utilizes a first group of probes to perform a high voltage stress (HVS) test on a first chip, and utilizes a second group of probes to perform a function test on a second chip, where a period of the high voltage stress test overlaps a period of the function test, thereby greatly decreasing the test time of the wafer.

11 Claims, 14 Drawing Sheets

WAFER TEST SYSTEM WHEREIN PERIOD OF HIGH VOLTAGE STRESS TEST OF ONE CHIP OVERLAPS PERIOD OF FUNCTION TEST OF OTHER CHIP

BACKGROUND OF THE INVENTION

1. Field of the Invention

The present invention relates to a wafer and a test technique thereof. More particularly, the present invention relates to a wafer and a test technique thereof capable of shortening test time.

2. Description of Related Art

When a chip is in wafer stage, it is necessary to perform a chip probe (CP) test on each chip in the wafer, so as to filter chips with defects, and to reduce the fabricating cost. Common CP test includes two stages, namely a high voltage stress (HVS) test and a function test. For the HVS test, an operating voltage exceeding an operating voltage specified by an instruction (or referred to as specification) of the chip is provided to the chip in a short time, and simultaneously some basic signals required by the chip are provided, such that the chip operates under an over-high operating voltage. When the chip operates under the over-high operating voltage, the defects of the chip can be further deteriorated in a short time. Therefore, the function test perform subsequently can be used to further inspect the chips.

Generally speaking, the chips on the wafer each has a great number of input ends and output ends (may be totally hundreds of pads), so when the CP test is performed, it is necessary for a wafer test device to have probes with a corresponding quantity to perform the CP test. However, the probes of the wafer test device are quite expensive, and in consideration of the cost, it is impossible to greatly increase the probes of the wafer test device, so usually the wafer test device can only perform the CP test on one chip on the wafer. Detailed description on various steps of the wafer test is provided below together with the drawings.

FIG. 1 is an architecture view of a conventional wafer test system. Referring to FIG. 1, a wafer to be tested 100 has a plurality of chips (indicated by chips 111 and 112). When a test station 150 intends to perform the CP test on the chip 111 on the wafer 100, firstly, the test station 150 controls a mechanical arm (not shown) to move a substrate 130, thereby driving a probe group 140 to contact pads of the chip 111. Next, the test station 150 provides a power source higher than a rated operating voltage and basic operating signals to the chip 111 through the probe group 140, thereby performing the HVS test for approximately 0.3-0.6 seconds. If the chip 111 has defects, the HVS test may deteriorate the defects of the chip 111, otherwise the HVS test may not affect the function of the chip 111.

After the HVS test on the chip 111 is finished, the test station 150 performs the function test on the chip 111 for approximately 0.3 seconds. During the function test, the test station 150 again provides some basic operating signals and a rated power source to the input ends of the chip 111 through the probe group 140, and reads output signals of the chip 111 through the probe group 140. Therefore, the test station 150 can determine whether the function of the chi 111 is normal or not. In this manner, the CP test of the chip 111 is finished. Next, the test station 150 further controls the mechanical arm to move the probe group 140, so as to make the probe group 140 contact pads of a next chip (chip 112), thereby performing the CP test on the chip 112. Similarly, the CP test is performed on each chip in the wafer 100, and it is not described here.

Suppose that the wafer 100 has 1500 chips, the HVS test for a single chip takes 0.3 seconds and the function test for a single chip takes 0.3 seconds. The time cost by the CP test of the total 1500 chips needs 1500*(0.3+0.3)=900 seconds. If the HVS test for a single chip takes 0.6 seconds, the time cost by the CP test for the total 1500 chips needs 1500*(0.6+0.3)=1350 seconds. It is said that time is money. If it is possible to shorten the time cost by the CP test, the test efficiency of the wafer can be greatly improved, and the cost of the CP test can also be reduced.

SUMMARY OF THE INVENTION

Accordingly, the present invention is directed to provide a test system and method for shortening the test time and improving the test efficiency.

In order to solve the above problem, the present invention provides a wafer test system, which includes a wafer to be tested and a wafer test device. The wafer test device includes a substrate, a first group of probes, and a second group of probes. The wafer to be tested has a plurality of chips. The wafer test device is used to test the chip. The first group of probes is disposed under the substrate, for performing a HVS test on the chip. The second group of probes is disposed under the substrate, for performing a function test on another chip. A period of the HVS test overlaps a period of the function test.

From another point of view, the present invention provides a wafer test method, which includes selecting a first chip from the wafer to be tested to perform the HVS test, and selecting a second chip from the wafer to be tested to perform the function test, where the period of the HVS test overlaps the period of the function test.

From still another point of view, the present invention provides a wafer test device for testing a plurality of chips of the wafer. The wafer test device includes a substrate, a first group of probes, and a second group of probes. The first group of probes is disposed under the substrate for performing the HVS test on a chip. The second group of probes is disposed under the substrate for performing the function test on another chip. The period of the HVS test overlaps the period of the function test.

From yet another point of view, the present invention provides a wafer including a plurality of chips, where each chip respectively includes a core circuit, a primary pad, and a secondary pad. The primary pad is coupled to the core circuit. The secondary pad is connected in parallel with the primary pad, for providing an electrical connection interface to the probes of the wafer test device. The period of the HVS test performed on the first chip of the wafer overlaps the period of the function test performed on the second chip of the wafer.

In an embodiment of the present invention, each chip respectively further includes a build in self test (BIST) circuit. The BIST circuit is coupled between the core circuit and the primary pad. The wafer test device has a first group of probes and a second group of probes. By contacting the first group of probes with the secondary pad, the wafer test device controls the BIST circuit to provide test signals to the core circuit, so as to perform the HVS test. In another embodiment, by contacting the second group of probes with the secondary pad, the wafer test device controls the BIST circuit to provide test signals to the core circuit, so as to perform the function test.

The present invention uses the first group of probes to perform the HVS test on a chip, and uses the second group of probes to perform the function test on another chip, where the period of the HVS test overlaps the period of the function test, thereby greatly reducing the test time of the wafer.

In order to make the aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Generally speaking, the CP test performed on the wafer can be divided into two stages, namely, an HVS test and a function test. As for the chips of a source driver, it is necessary to provide test signals to input ends of the chips to perform the function test, and it is also necessary to detect whether the signals of output ends of the chips are normal or not, so it requires approximately 600-700 probes to perform the function test.

It should be noted that the objective of the HVS test is to give an operating voltage higher than the rated operating voltage to the chip in a short time, so as to further deteriorate the chip having defects, thereby inspecting the chip having defects during the function test more easily. Therefore, on practical application, when performing the HVS test, it is only necessary to provide the test signals to the input ends of the chip such that the chip operates in the high voltage operation state. It is determined whether the chip is normal by the function test performed on the chip.

For example, when the HVS test is performed on the chip of the source driver, vddd, vdda, vssd, vssa, gma3, gma8, clkn, clkp, pol, eio and stb signals are provided to the input ends of the chip respectively through 12 probes, so as to achieve the objective of the HVS test. vddd, vdda, vssd, and vssa are power source voltages, gma3 is a positive polarity gamma voltage, gma8 is a negative polarity gamma voltage, clkn and clkp are a differential pair of clock signals, eio is an initial signal of beginning to read the data by the source driver (or referred to as data initial pulse), stb is a line latch signal, and pol is a polarity control signal. After the HVS test is performed, the function test is performed on the chip, so as to easily detect whether the chip is normal or not. In this manner, the HVS test on the chip is performed with fewer probes.

In this embodiment, the HVS test only requires quite a few probes denoted as the first group of probes, and the function test requires several hundred probes, 600-700 for example, denoted as the second group of probes. When the function test is performed on a chip, the first group of probes can be used to simultaneously perform the HVS test on a next chip. Further description is given below together with the drawings.

Figure 1:
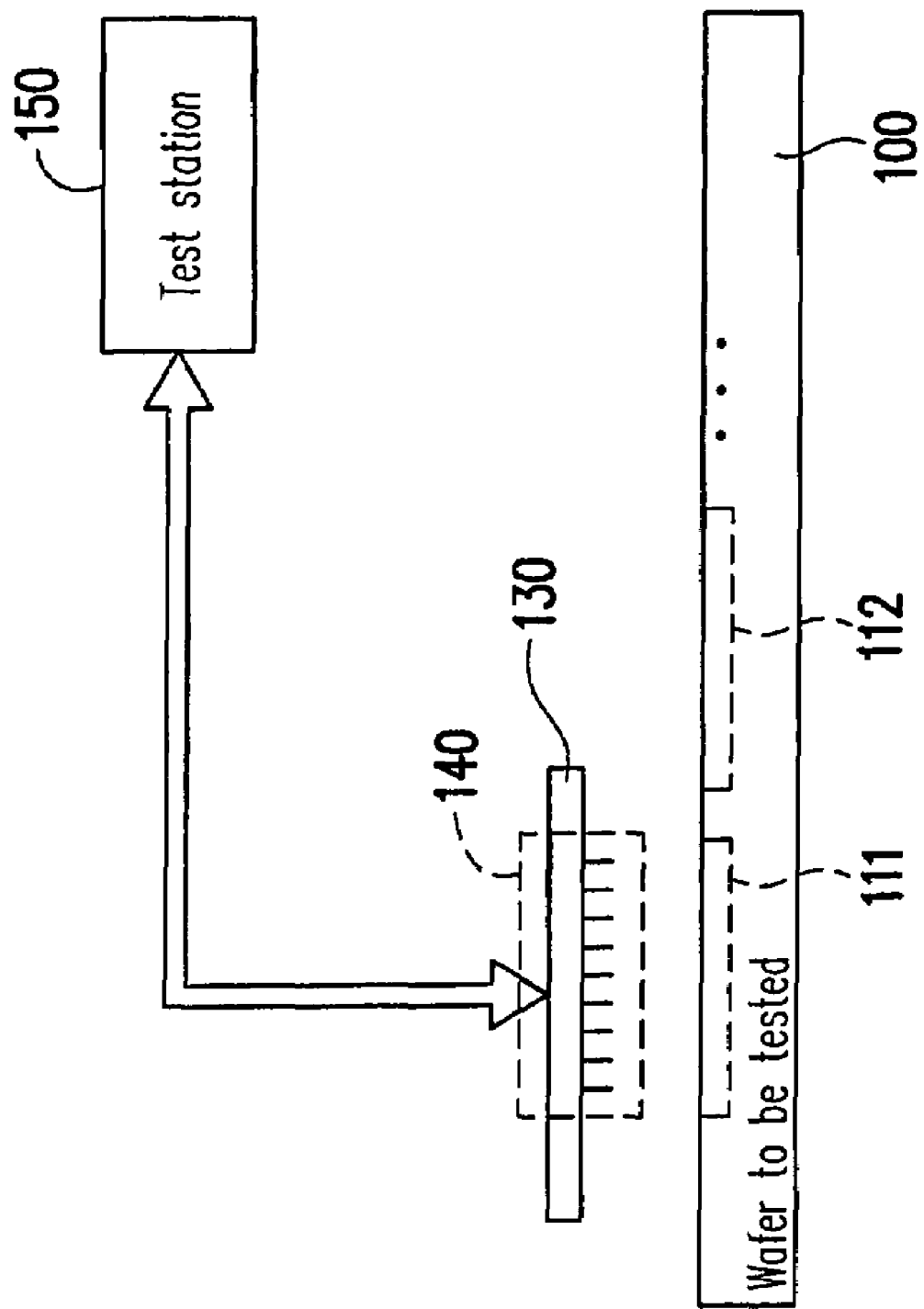
FIG. 1 is an architecture view of a conventional wafer test system.
Figure 2A:
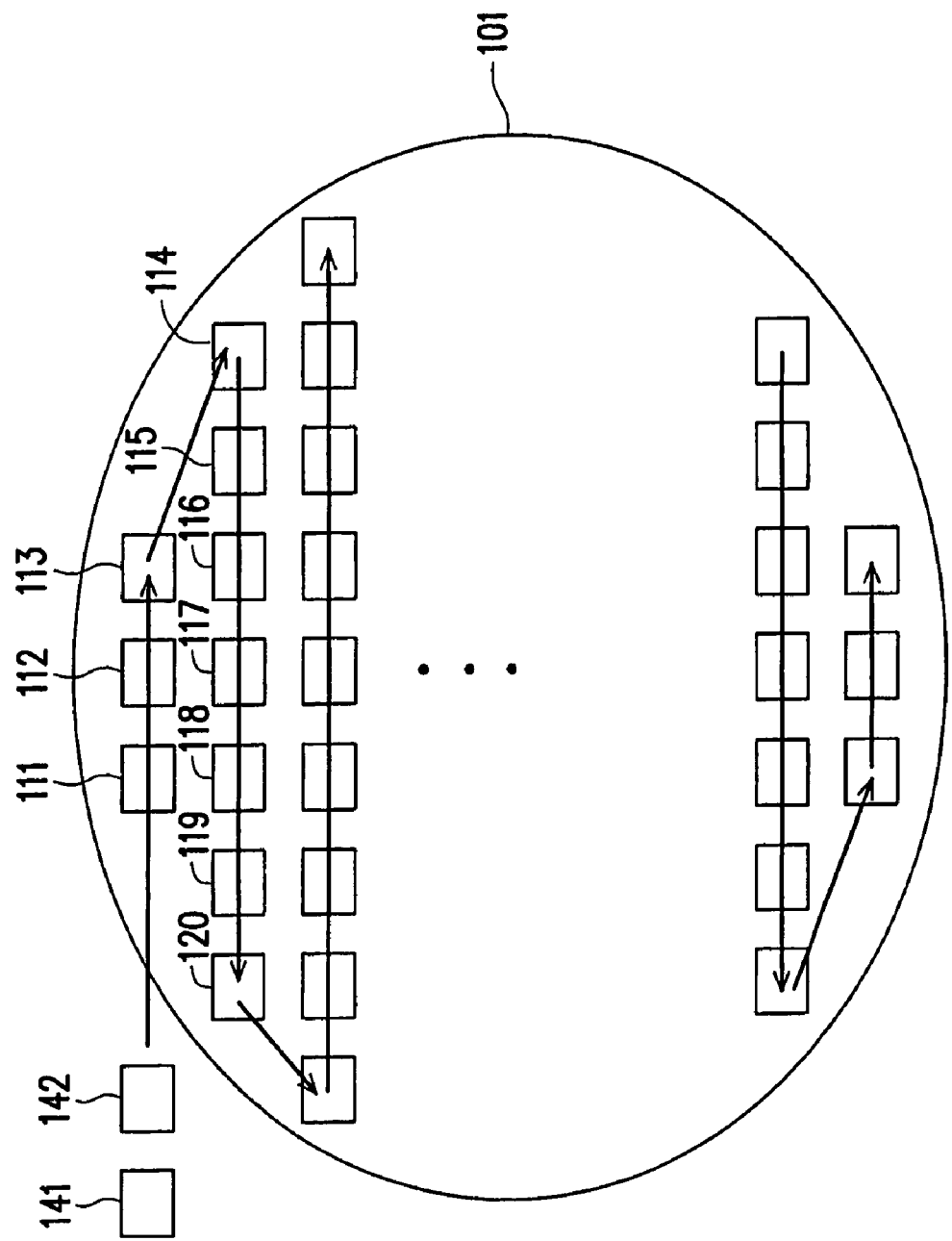
FIG. 2A is a schematic view of the test of a wafer according to a first embodiment of the present invention.
Figure 3:
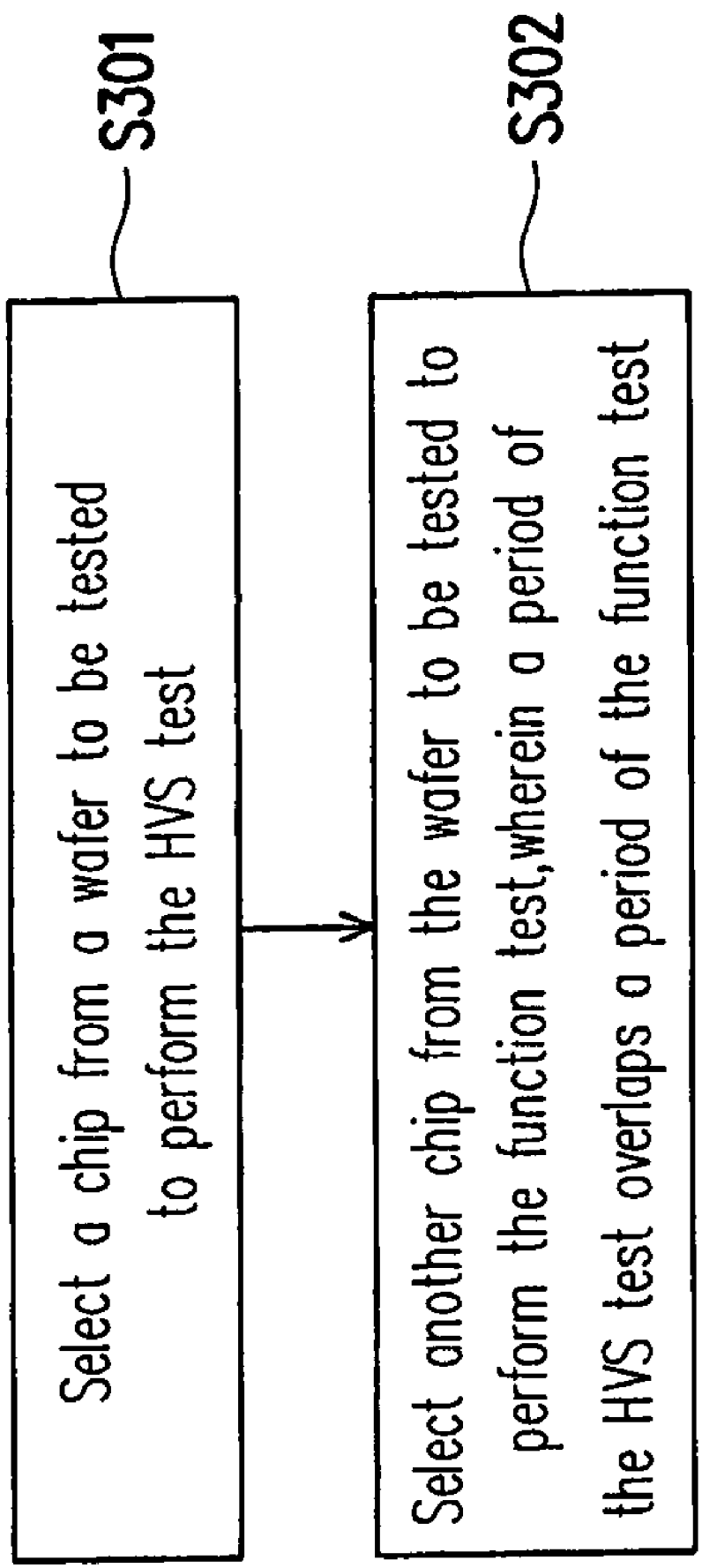
FIG. 3 is a flow chart of a wafer test method according to a first embodiment of the present invention.

FIG. 2A is a schematic view of the test of a wafer according to a first embodiment of the present invention, and FIG. 3 is a flow chart of a wafer test method according to a first embodiment of the present invention. Referring to FIGS. 2A and 3, in this embodiment, it is assumed that a wafer to be tested 101 includes 1500 chips, and the time cost by performing the function test and the HVS test on each chip is 0.3 seconds. In this embodiment, the second group of probes (denoted as a probe group 141) and the first group of probes (denoted as a probe group 142) operate independently, and are respectively used to perform the function test and the HVS test on the chips. Firstly, in a first period (0-0.3 seconds), the probe group 142 is used to perform the HVS test on the chip 111. Next, the chips are tested in sequence along the direction of an arrow, but the present invention is not limited here. For example, in a second period (0.3-0.6 seconds), the probe group 142 is used to perform the HVS test on the chip 112 (step S301), and simultaneously the probe group 141 is used to perform the function test on the chip 111 (step S302), so as to finish the HVS test and the function test of the chip 111.

In view of the above, in a third period (0.6-0.9 seconds), the probe group 142 is used to perform the HVS test on a chip 113 (step S301), and simultaneously the probe group 141 is used to perform the function test on the chip 112 (step S302). In this manner, the HVS test and the function test of the chip 112 are finished. The test steps for the subsequent chips can be similarly performed. Therefore, the total time cost on the function test and the HVS test of 1500 chips is 1500*0.3+ 0.3=450.3 seconds, and nearly half of the time is saved as compared with the 900 seconds in the conventional art.

It should be noted that although a possible type of the wafer test method is described in the above embodiment, those of ordinary skill in the art should know that the designs of the steps of the wafer test methods of different manufacturers are different, so the application of the present invention is not limited to this possible type. In other words, as long as the first group of probes is used to perform the HVS test on a chip, and the second group of probes is used to perform the function test on another chip, where a period of the HVS test overlaps a period of the function test, the spirit of the present invention is satisfied. Several embodiments are illustrated below to make those of ordinary skill in the art further understand the spirit of the present invention and implement the present invention accordingly.

Referring to FIG. 2A, in a second embodiment of the present invention, it is assumed that the wafer to be tested 101 has 1500 chips, and the time cost by performing the function test and the HVS test on each chip is respectively 0.3 seconds and 0.6 seconds. The test method of the wafer to be tested 101 can refer to the first embodiment. It should be noted that during each period, after the probe group 141 finishes the function test, it is necessary to wait for the probe group 142 to finish the HVS test, therefore each period must cost 0.6 seconds. In other words, the total time cost by performing the function test and the HVS test on 1500 chips is 1500*0.6+ 0.6=900.6 seconds, and nearly one third of the time is saved as compared with 1350 seconds in the conventional art.

Figure 2B:
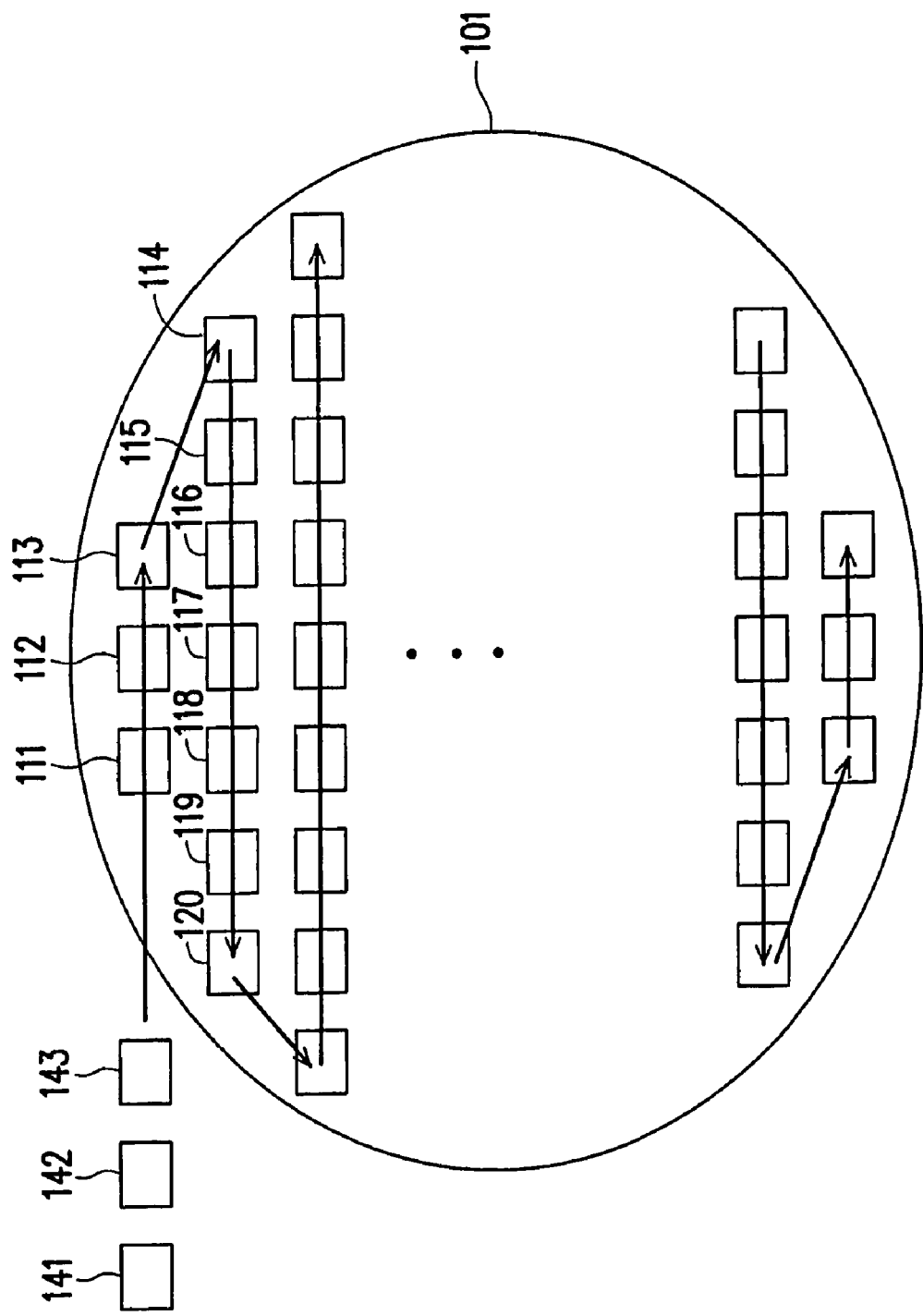
FIG. 2B is a schematic view of the test of a wafer according to a third embodiment of the present invention.

In the above embodiment, although two probe groups are set as an example for illustration, in other embodiments, more than three probe groups can also be used to perform the CP test of the wafer. For example, FIG. 2B is a schematic view of the test of a wafer according to a third embodiment of the present invention. It is assumed that the wafer to be tested 101 has 1500 chips, and the time cost by performing the function test and the HVS test on each chip is respectively 0.3 seconds and 0.6 seconds. In order to further save the test time of the wafer to be tested 101, in this embodiment, three probe groups are used to perform the wafer test. In brief, in this embodiment, the 0.6 seconds HVS test of the above embodiment is divided into two stages, respectively being 0.3 seconds and 0.3 seconds. More particularly, in this embodiment, the probe group 141 is used to perform the function test on the chip. The probe groups 142 and 143 are used to perform the HVS test on the chip.

In view of the above, in the first period (0-0.3 seconds), firstly the probe group 143 is used to perform the HVS test on the chip 111. Next, in the second period (0.3-0.6 seconds), the probe groups 142 and 143 are simultaneously used to respectively perform the HVS test on the chips 111 and 112. Next, in the third period (0.6-0.9 seconds), the probe group 141 is used to perform the function test on the chip 111, and the probe groups 142 and 143 are simultaneously used to perform the HVS test on the chips 112 and 113, so as to finish the HVS test and the function test on the chip 111. Similarly, the subsequent steps can be deduced by analog. Therefore, the total time cost on the function test and the HVS test of 1500 chips is 1500*0.3+0.6=450.6 seconds, and nearly two thirds of the time is saved as compared with the 1350 seconds in the conventional art.

It should be noted that in this embodiment, the HVS test formerly requiring to be continuously performed for 0.6 seconds is changed to two times of HVS tests of 0.3 seconds, and the effect may not be as good as the HVS test formerly requiring to be continuously performed for 0.6 seconds. However, those of ordinary skill in the art can suitably adjust the time of the HVS test to alleviate the above problem. For example, the HVS test formerly requiring to be continuously performed for 0.6 seconds is changed to two times of HVS tests of "0.4 seconds and 0.4 seconds" or "0.3 seconds and 0.4 seconds" etc. In this manner, not only the effect similar to that of the second embodiment can be achieved, but also the time of the CP test of the wafer can be greatly decreased.

Referring to FIG. 2B, those skilled in the art can also suitably adjust the test manner of the probe groups 141-143. For example, in the first period and the second period (0-0.6 seconds), firstly the probe group 142 is used to perform the HVS test on the chip 111, and simultaneously the probe group 143 is used to perform the HVS test on the chip 112. Next, in the third period and the fourth period (0.6-1.2 seconds), the probe group 142 is continuously used to perform the HVS test on the chip 113, and simultaneously the probe group 143 is used to perform the HVS test on the chip 114. In the third period (0.6-0.9 seconds), the probe group 141 is simultaneously used to perform the function test on the chip 111, so as to finish the HVS test and the function test of the chip 111.

Next, in the fourth period (0.9-1.2 seconds), the probe group 141 is used to perform the function test on the chip 112, so as to finish the HVS test and the function test of the chip 112. The test steps for the subsequent chips are similarly performed. The method can not only shorten the CP test time and can but also decrease the times of the contacting of each chip and probe group, thereby reducing the risk of damaging each chip.

Figure 4A:
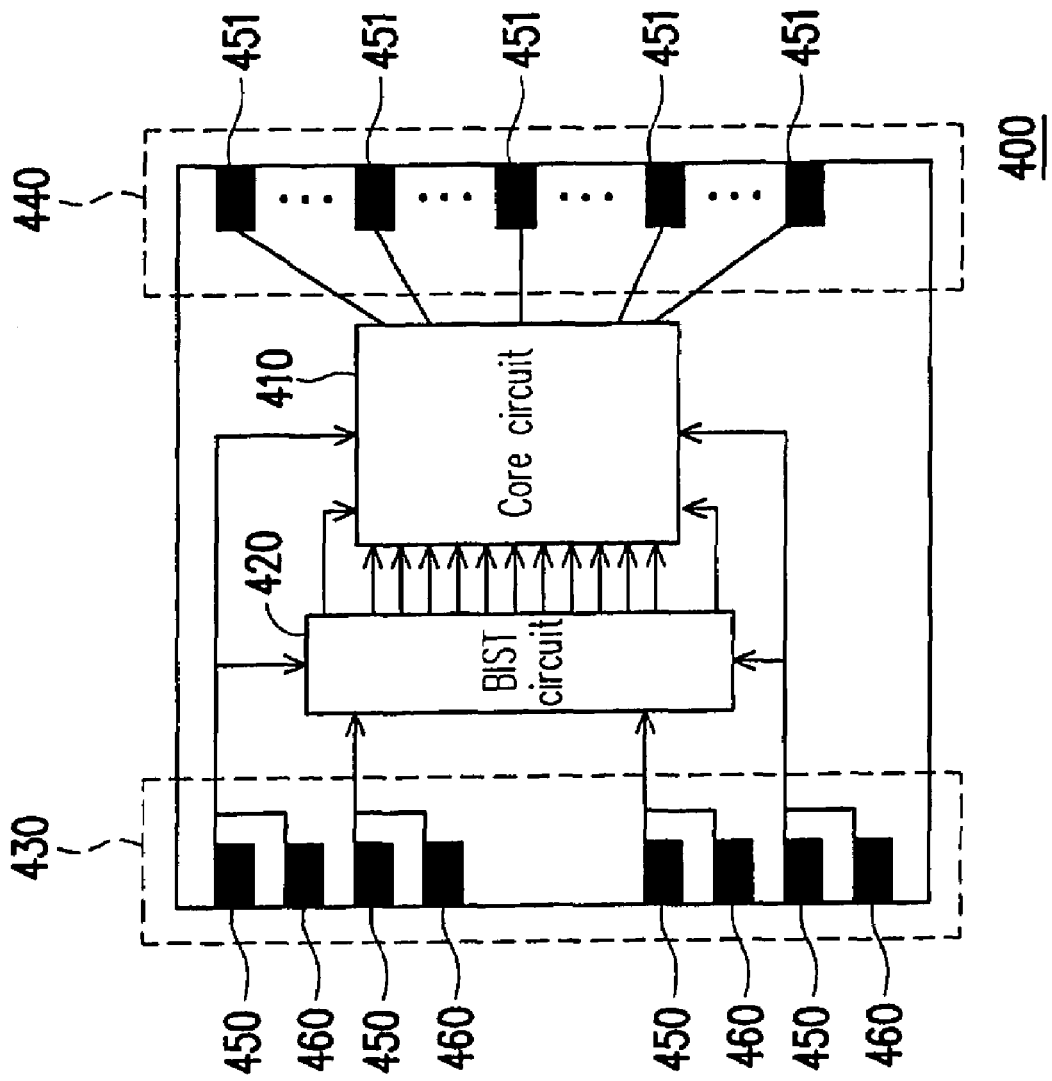
FIG. 4A is an architecture view of a chip according to a fourth embodiment of the present invention.

In the other aspect, in the above embodiments, as the times of the pad of each chip in the wafer being contacted by the probe are increased, the risk of damaging the pad of each chip by the probe group is increased. Therefore, a secondary pad is added for test on each chip to alleviate the above problem. For example, FIG. 4A is an architecture view of a chip according to a fourth embodiment of the present invention. Referring to FIG. 4A, in this embodiment, a chip 400 (e.g., a source driver) includes a core circuit 410, a build in self test (BIST) circuit 420, an input area 430, and an output area 440. The input area 430 includes a plurality of primary pads 450 and secondary pad 460 with a corresponding quantity. The output area 440 includes a plurality of primary pads 451. The BIST circuit 420 is coupled to the core circuit 410. The primary pads 450 are connected in parallel with the secondary pads 460, and are coupled to the BIST circuit 420 and/or the core circuit 410. The primary pads 451 are coupled to the core circuit 410.

It should be noted that if the embodiment of the present invention is used to perform the CP test (the HVS test and the function test), the pads of the input area 430 must be contacted by the probe group for at least twice, such that it is possible to result in the damage of the pads of the input area 430. Accordingly, in this embodiment, secondary pads 460 connected in parallel with the primary pads 450 are added, so when the CP test is performed, the probe group may contact one of the primary pads 450 and the secondary pads 460 to perform the CP test. More particularly, in this embodiment, the probe group is used to contact the secondary pads 460 to perform the CP test, and thereby preventing the primary pads 450 from being damaged. In addition, the quantity of the primary pads 450 in the input area 430 is quite small (less than 12). Therefore, even the secondary pads 460 are added for the primary pads 450, the cost is quite low. Further, secondary pads can also be added and connected in parallel with the primary pads 451 of the output area 430, so as to prevent the primary pads 451 from being damaged during the CP test process.

Figure 4B:
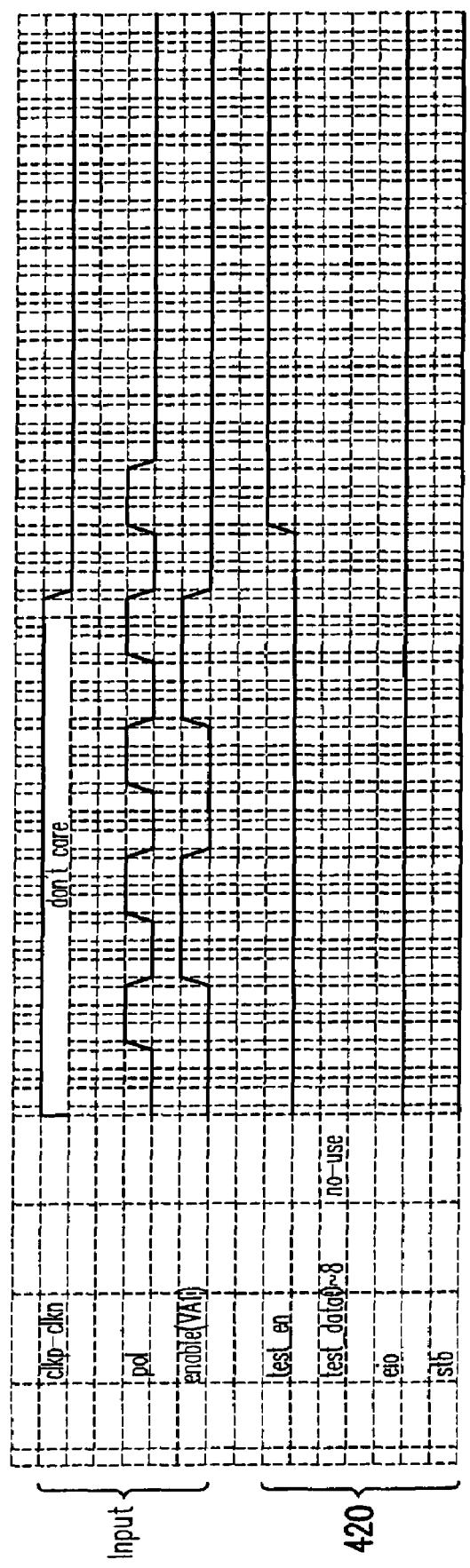
FIG. 4B is a timing chart of the initiation of a BIST circuit of FIG. 4A.
Figure 4C:
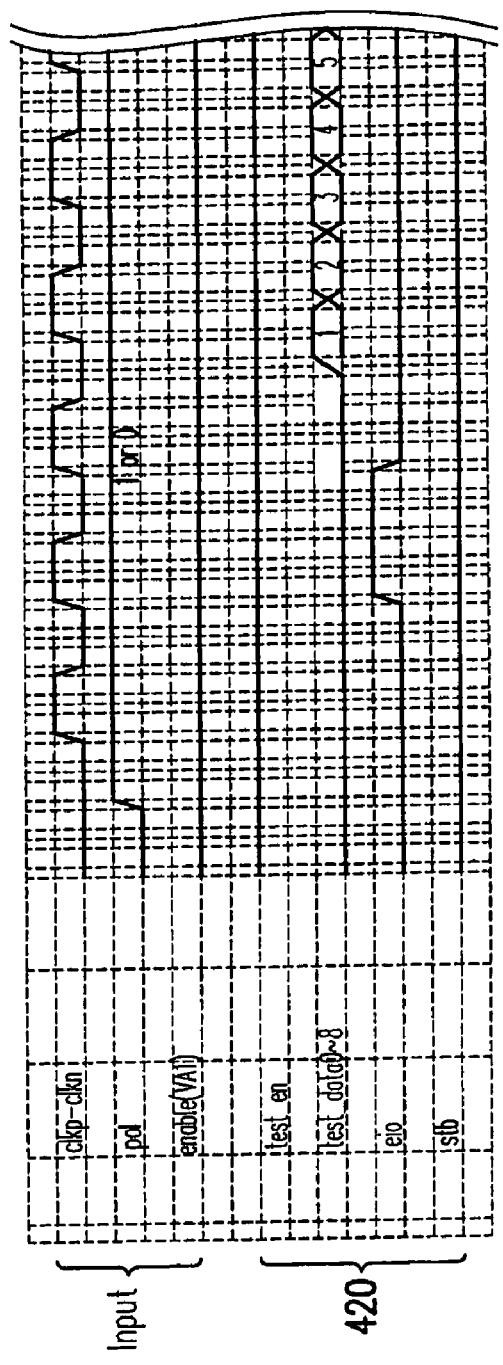
FIG. 4C is a timing chart of the operation and the stop of the BIST circuit of FIG. 4A.
Figure 4C:
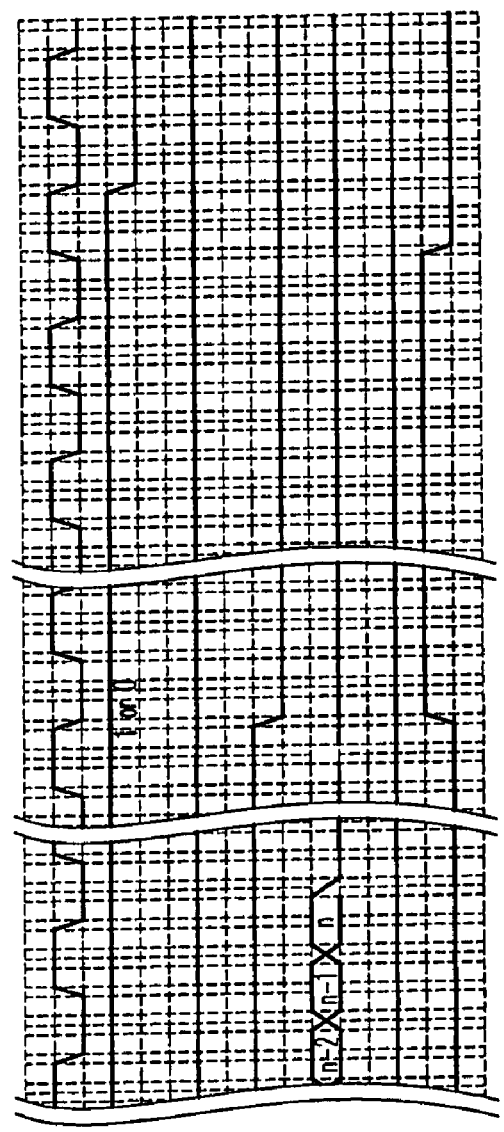

In the other aspect, this embodiment further has another advantage. The BIST circuit 420 is used to greatly decrease the quantity of the primary pads 450 of the input area 430. FIG. 4B is a timing chart of the initiation of the BIST circuit of FIG. 4A, and FIG. 4C is a timing chart of the operation and the stop of the BIST circuit of FIG. 4A. When performing the CP test, for example, each probe respectively provides signals, for example voltage source, clkp, clkn, pol, and enable (VA1), to the secondary pads 460 of the input area 430, where clkp and clkn are clock signals, pol is a polarity control signal, and enable (VA1) is an initiation signal of the BIST circuit 420.

In view of the above, the BIST circuit 420 may generate other control signals for testing by a voltage dividing, or by the internal circuit of the BIST circuit 420. More particularly, the BIST circuit 420 can provide signals, namely test_en, test_data0-test_data8, eio, and stb, thereby providing the signals to the core circuit 410 to perform the CP test. Test_en is a test initiation signal, test_data0-8 are input data, eio is a data initial pulse, and stb is a line latch signal.

For example, in HVS test, the BIST 420 provides test_en, eio and stb signals to the core circuit 410; in function test, the BIST 420 further provides input data, i.e. test dataO-test_data8, to the core circuit 410.

In this manner, definitely the quantity of the probes used to perform the CP test is decreased accordingly, so as to save the cost. It should be noted that each signal provided by the present invention is only a particular embodiment, and the present invention is not limited here. In another embodiment, the probes can provide high voltage to the secondary pads of the chip. According to the high voltage, the BIST circuit 420 provides a gamma voltage, an input data, a data initial pulse, a line latch line, and a polarity control signal to the core circuit 410, so as to perform the HVS test and the function test.

Figure 5A:
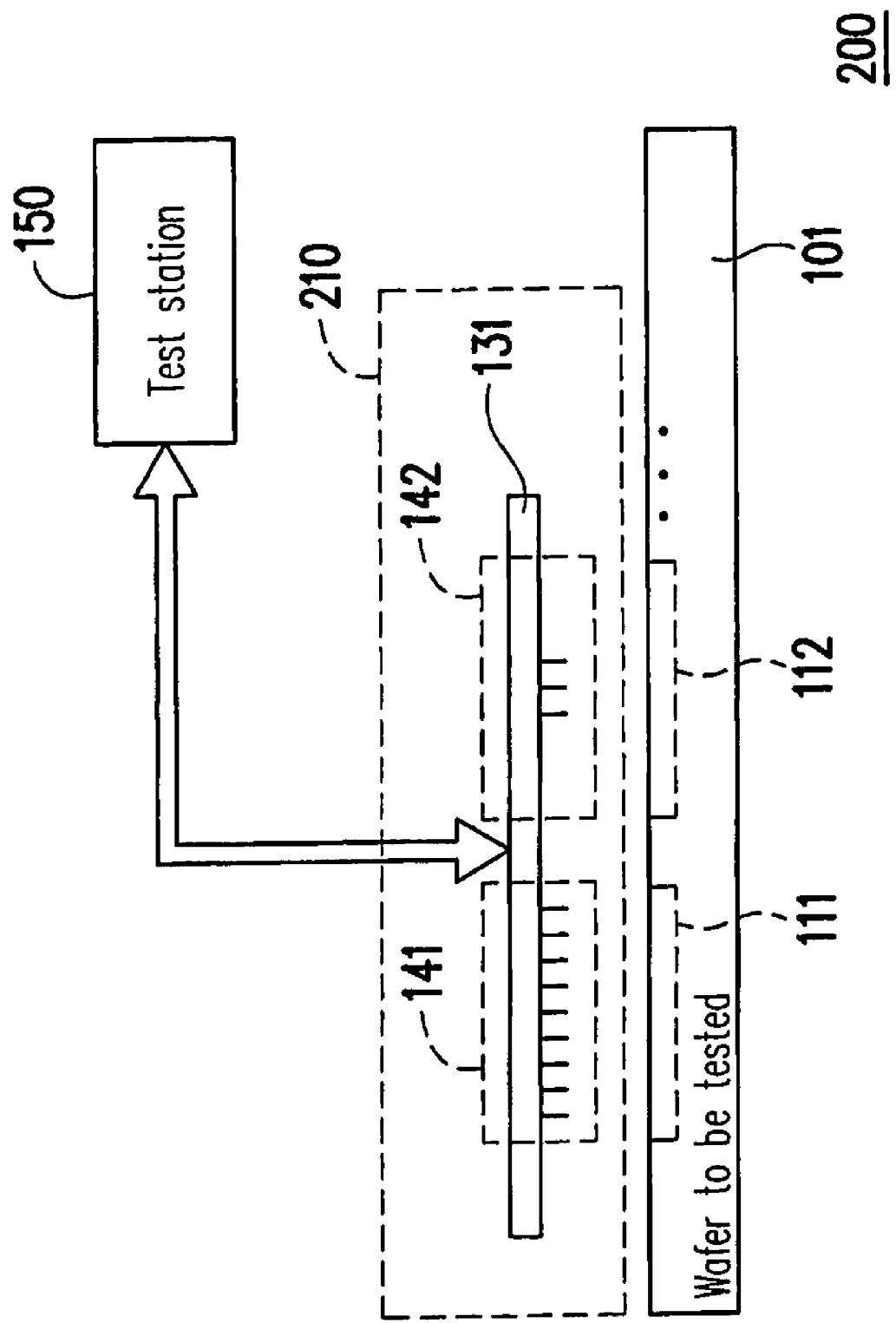
FIG. 5A is an architecture view of a wafer test system according to a fifth embodiment of the present invention.

In the above embodiment, the probe group used to perform the HVS test and the probe group used to perform the function test can operate separately. However, in another embodiment, they can also be disposed on the same substrate. For example, FIG. 5A is an architecture view of a wafer test system according to a fifth embodiment of the present invention. Referring to FIG. 5A, a wafer test system 200 includes a wafer to be tested 101, a test station 150, and a wafer test device 210. A wafer test device 210 includes a substrate 131, a first group of probes (the probe group 142 here), and a second group of probes (the probe group 141 here). The wafer to be tested 101 has a plurality of chips. The wafer test device 210 is used to test each chip on the wafer to be tested 101. The probe group 142 is disposed under the substrate 131, for perform the HVS test on the chips. The probe group 141 is disposed under the substrate 131, for performing the function test on the chips. The test station 150 can control a mechanical arm (not shown) to move the wafer test device 210, thereby driving the probe groups 141 and 142 to contact the pads of the chips, and providing corresponding test signals to perform the CP test. In brief, the difference between this embodiment and the first embodiment is that this embodiment only needs to use a mechanical arm to simultaneously drive the probe groups 141 and 142, thereby saving the cost. Further description is given below together with the drawings.

Figure 5B:
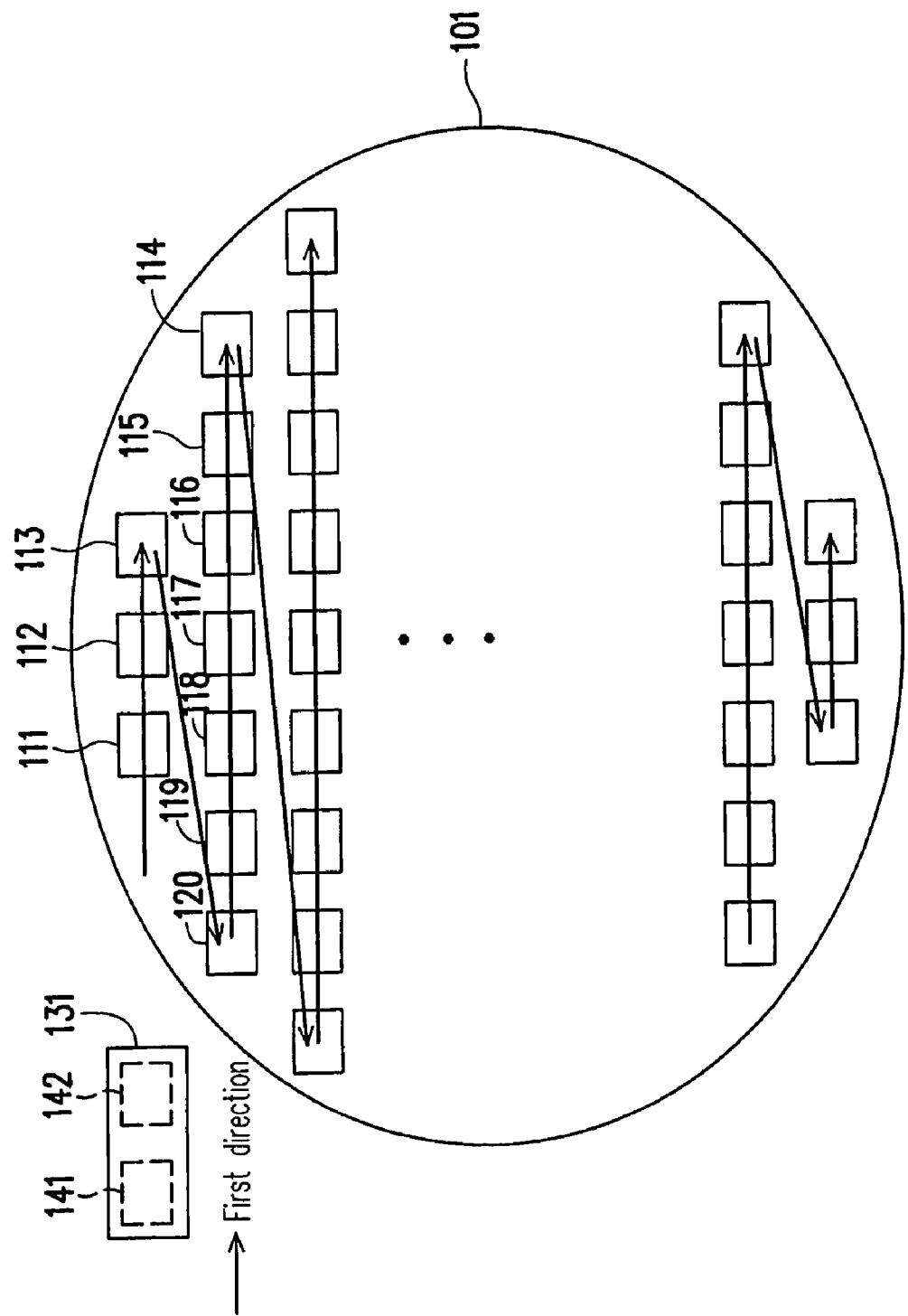
FIG. 5B is a schematic view of the test of a wafer of FIG. 5A.

FIG. 5B is a schematic view of the test of a wafer of FIG. 5A. Referring to FIGS. 5A and 5B, it is assumed that the wafer to be tested 101 includes 1500 chips, and the time cost by performing the function test and the HVS test on each chip is respectively 0.3 seconds. In the first period to the third period (0-0.9 seconds), the first embodiment can be referred, and it is not described here. In the fourth period (0.9-1.2 seconds), the probe group 141 is used to perform the function test on the chip 113, so as to finish the HVS test and the function test of the chip 113. At this time, the probe group 142 may not provide the signals. It should be noted that when the substrate 131 is moved to the next row of chips (114-120), it is necessary to perform the HVS test and the function test on the chips in sequence in the same direction (the first direction), such that each chip firstly performs the HVS test and then performs the function test.

For example, the chips are tested in sequence along an arrow direction, but the present invention is not limited here. More particularly, in a fifth period (1.2-1.5 seconds), the probe group 142 can be used to perform the HVS test on the chip 120, at this time the probe group 141 may not provide the signals. In a sixth period (1.5-1.8 seconds), the probe group 142 is used to perform the HVS test on the chip 119, and simultaneously the probe group 141 is used to perform the function test on the chip 120, so as to finish the HVS test and the function test of the chip 120. In a seventh period (1.8-2.1 seconds), the probe group 142 is used to perform the HVS test on the chip 118, and simultaneously the probe group 141 is used to perform the function test on the chip 119, so as to finish the HVS test and the function test of the chip 119. Similarly, the subsequent steps can be deduced by analog, and thus the CP test time is greatly decreased.

Figure 5C:
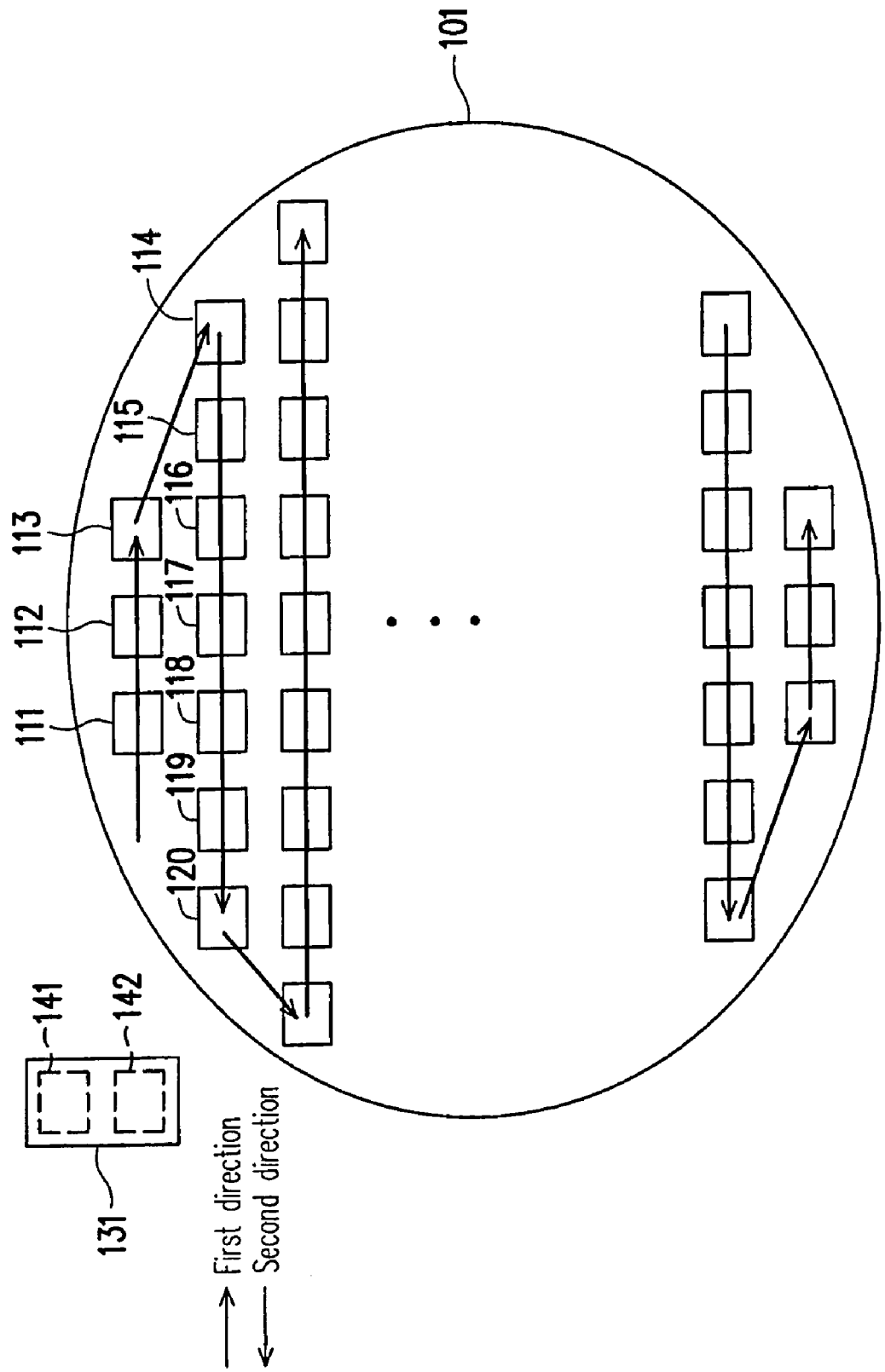
FIG. 5C is a schematic view of the test of another wafer of FIG. 5A.

In the above embodiments, the arrangement sequence of the probe groups 141 and 142 is the same as the test sequence direction of the chips (as shown by arrows of FIG. 5B), but it is not limited here. For example, FIG. 5C is a schematic view of the test of another wafer of FIG. 5A. Referring to FIGS. 5A and 5C, in this embodiment, the arrangement sequence of the probe groups 141 and 141 is vertical to the test sequence direction of the chips. Therefore, it is possible to perform the CP test on the first row of chips along the first direction, and in addition, it is possible to perform the CP test on the second row of chips along the second direction.

For example, in the first period (0-0.3 seconds), the probe group 142 is used to perform the HVS test on the chip 111. In the second period (0.3-0.6 seconds), the probe group 142 is used to perform the HVS test on the chip 112. In the third period (0.6-0.9 seconds), the probe group 142 is used to perform the HVS test on the chip 113. In the fourth period (0.9-1.2 seconds), the probe group 142 is used to perform the HVS test on the chip 114. In the fifth period (1.2-1.5 seconds), the probe group 142 is used to perform the HVS test on the chip 115.

It should be noted that in the sixth period (1.5-1.8 seconds), the probe group 142 is used to perform the HVS test on the chip 116, and simultaneously the probe group 141 is used to perform the function test on the chip 113, so as to finish the HVS test and the function test on the chip 113. In the seventh period (1.8-2.1 seconds), the probe group 142 is used to perform the HVS test on the chip 117, and simultaneously the probe group 141 is used to perform the function test on the chip 112, so as to finish the HVS test and the function test of the chip 112. The test steps for the subsequent chips can be performed similarly, thereby saving the time of the CP test, and decreasing the moving path of the substrate 131 to further save the time of the CP test.

Figure 6A:
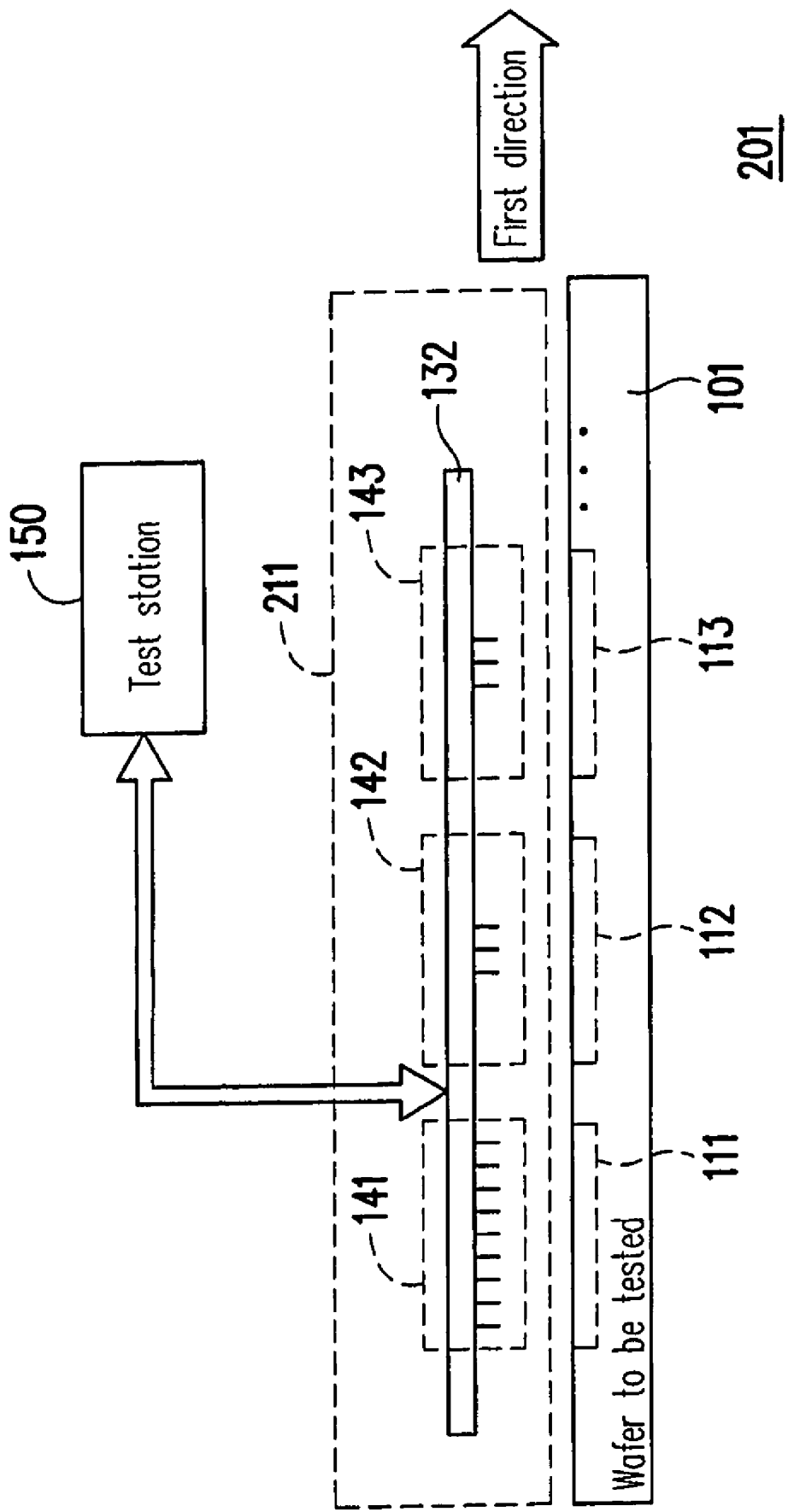
FIG. 6A is an architecture view of the wafer test system according to a sixth embodiment of the present invention.

According to the teaching of the above embodiment, those skilled in the art can also dispose the probe groups 141-143 of the third embodiment in the same substrate. For example, FIG. 6A is an architecture view of the wafer test system according to a sixth embodiment of the present invention. Referring to FIG. 6A, a wafer test system 201 includes a wafer to be tested 101 and a wafer test device 211. The implementation of elements having the same reference numerals as those in the above embodiment can refer to the implementation thereof. It should be noted that the wafer test device 211 includes a substrate 132 and probe groups 141-143. The probe groups 141-143 are all disposed under the substrate 132, for respectively performing the HVS test, the HVS test and the function test on the chips. Further description is given below together with the drawings.

Figure 6B:
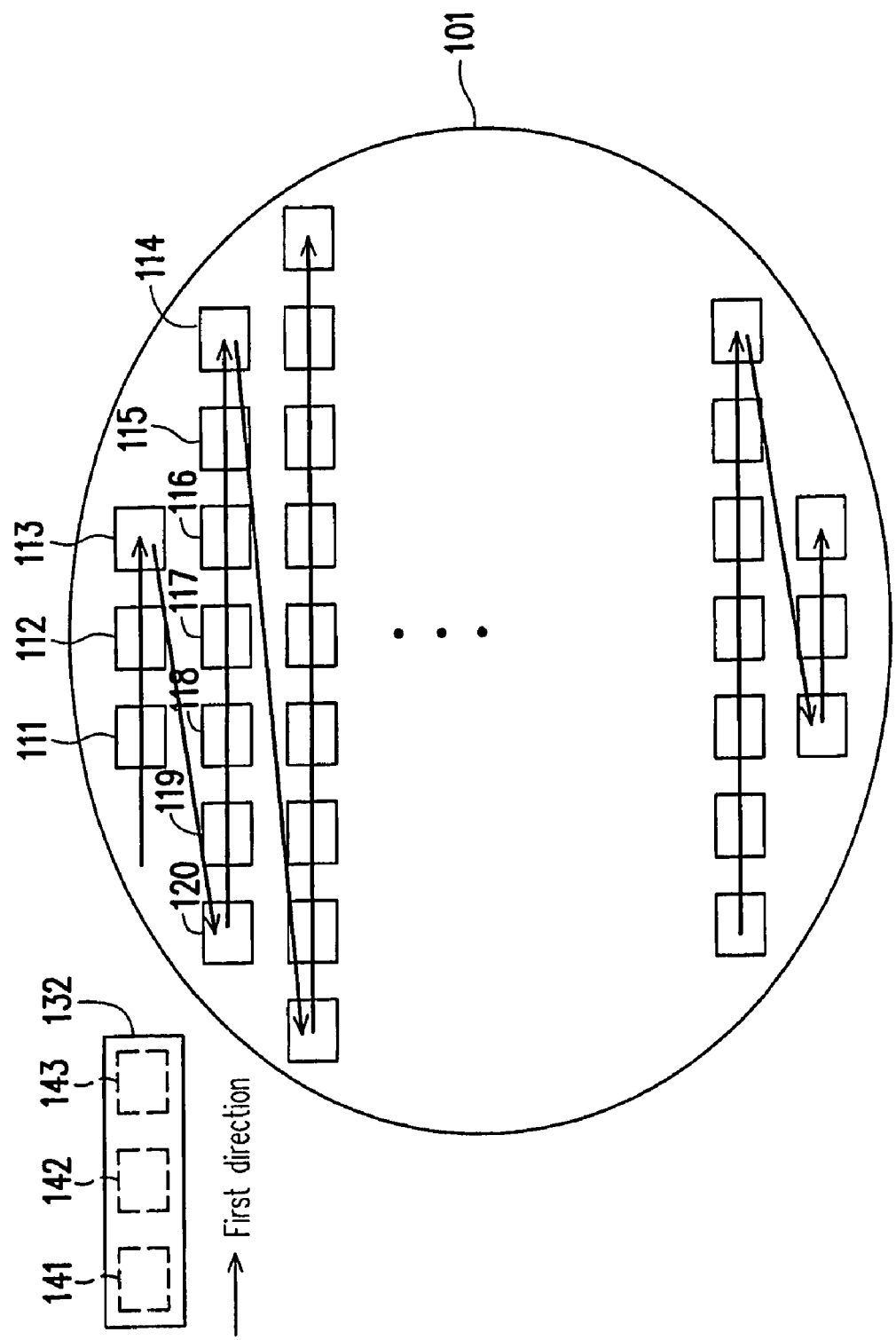
FIG. 6B is a schematic view of the test of a wafer of FIG. 6A.

FIG. 6B is a schematic view of the test of a wafer of FIG. 6A. Referring to FIGS. 6A and 6B, it is assumed that the wafer to be tested 101 includes 1500 chips, and the time cost by performing the function test and the HVS test on each chip is respectively 0.3 seconds and 0.6 seconds. Therefore, in this embodiment, the 0.6 seconds HVS test is divided into two stages, respectively being 0.3 seconds and 0.3 seconds. For the first period to the third period (0-0.9 seconds), please refer to the third embodiment, and it is not described here. In the fourth period (0.9-1.2 seconds), the probe group 141 is used to perform the function test on the chip 112, and simultaneously the probe group 142 is used to perform the HVS test on the chip 113, so as to finish the HVS test and the function test of the chip 112. At this time, the probe group 143 may not provide the signals. In the fifth period (1.2-1.5 seconds), the probe group 141 is used to perform the function test on the chip 113, so as to finish the HVS test and the function test of the chip 113. At this time, the probe group 142 and 143 may not provide the signals.

It should be noted that when the substrate 132 is moved to the next row of chips (114-120), it is necessary to perform the HVS test and the function test on the chip in sequence in the same direction, such that each chip firstly performs the HVS test and then performs the function test. For example, the test on the chips can be performed in sequence along the arrow direction, but the present invention is not limited here. For example, in the sixth period (1.5-1.8 seconds), the probe group 143 is used to perform the HVS test on the chip 120. At this time, the probe groups 141 and 142 may not provide the signals.

In view of the above, in the seventh period (1.8-2.1 seconds), the probe group 143 is used to perform the HVS test on the chip 119, and the probe group 142 is used to perform the HVS test on the chip 120. In an eighth period (2.1-2.4 seconds), the probe groups 143 and 142 are used to respectively perform the HVS test on the chips 118 and 119, and the probe group 141 is used to perform the function test on the chip 120, so as to finish the HVS test and the function test of the chip 120. Similarly, the subsequent steps can be deduced by analog, thereby greatly decreasing the CP test time.

Figure 7A:
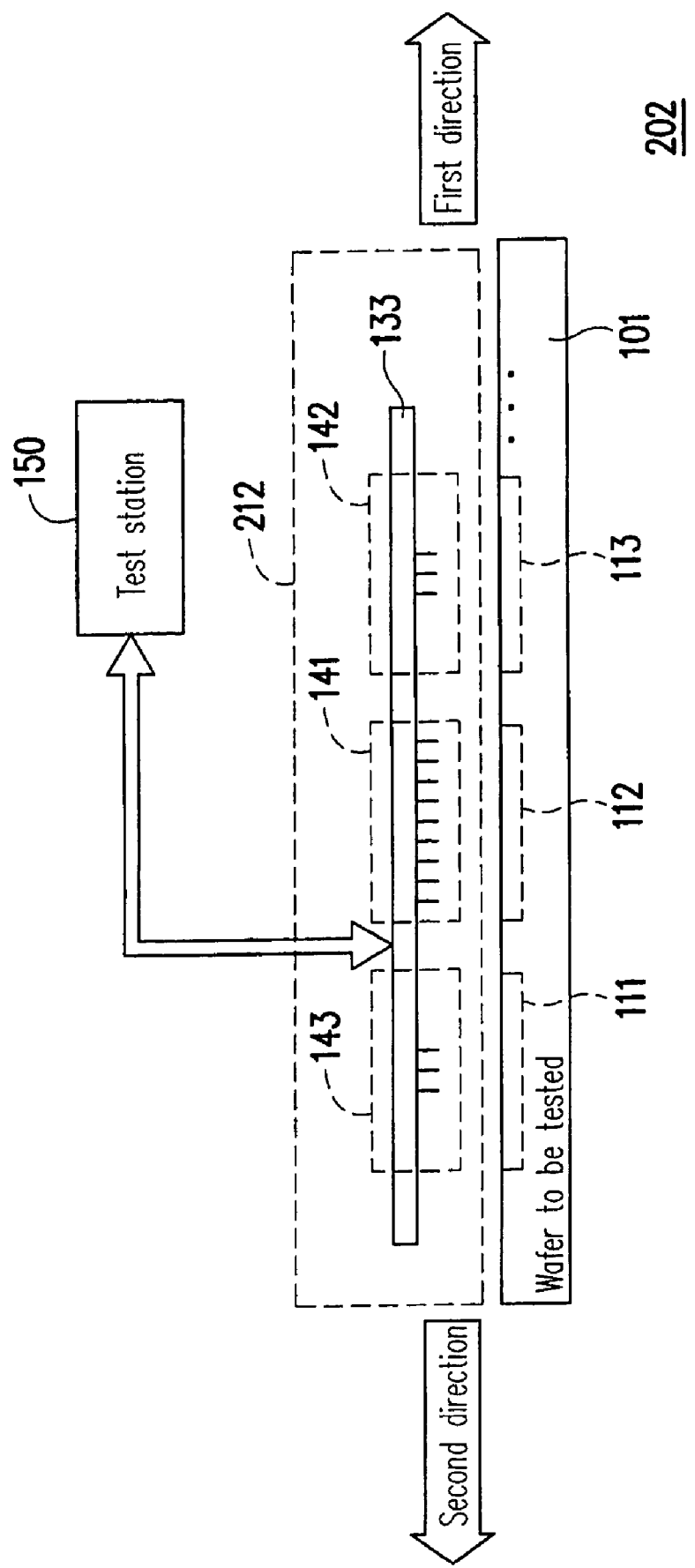
FIG. 7A is an architecture view of the wafer test system according to a seventh embodiment of the present invention.

FIG. 7A is an architecture view of the wafer test system according to a seventh embodiment of the present invention. Referring to FIG. 7A, a wafer test system 202 includes a wafer to be tested 101 and a wafer test device 212. The implementation of elements having the same reference numerals as those in the above embodiment can refer to the implementation thereof. It should be noted that the wafer test device 212 includes a substrate 133 and probe groups 141-143. The probe groups 141-143 are all disposed under the substrate 133, for respectively performing the HVS test, the HVS test and the function test on the chips. Further description is given below together with the drawings.

Figure 7B:
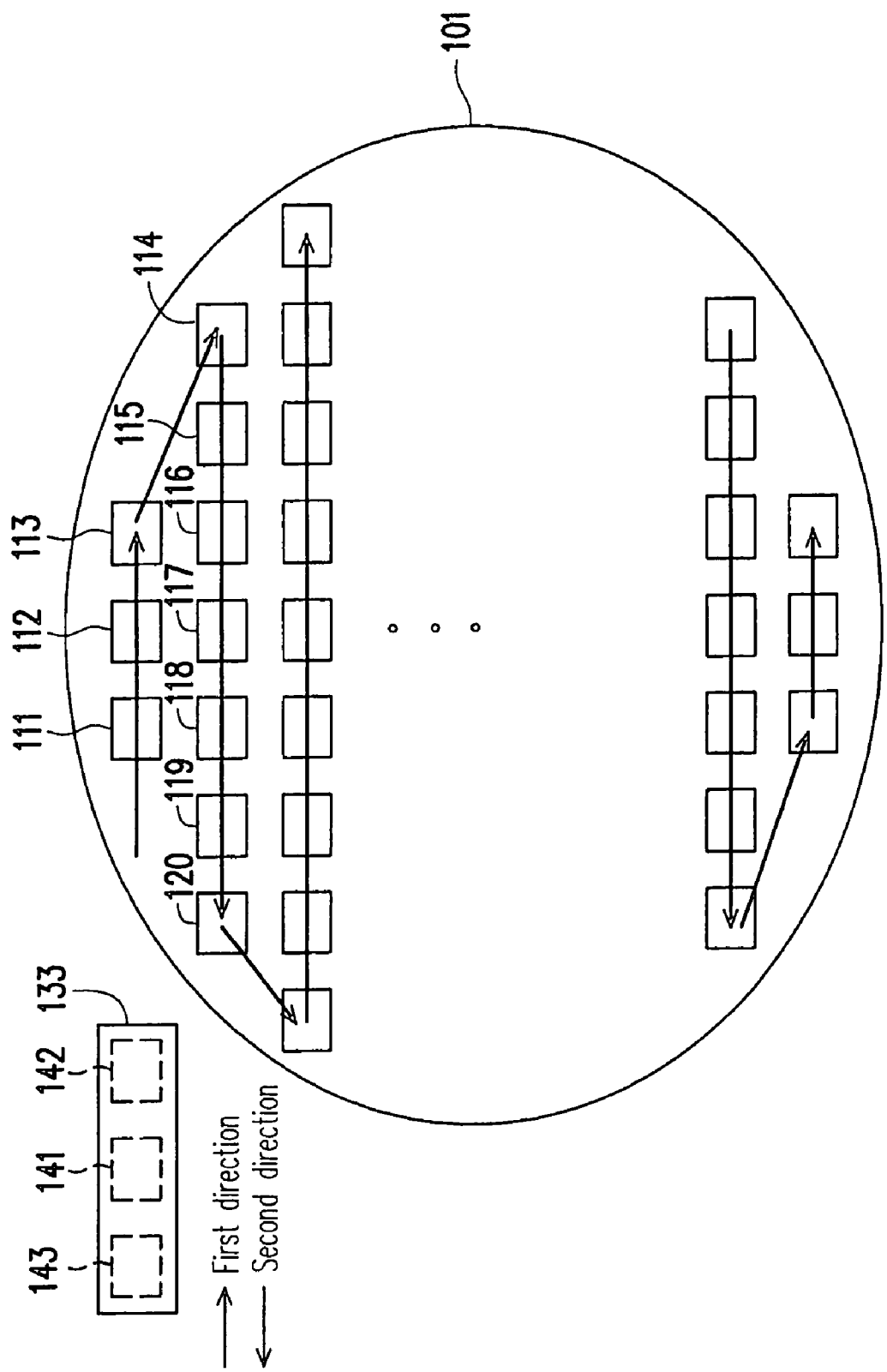
FIG. 7B is a schematic view of the test of a wafer of FIG. 7A.

FIG. 7B is a schematic view of the test of a wafer of FIG. 7A. Referring to FIGS. 7A and 7B, when the CP test is performed on the first row of chips (111-113), the CP test can be performed on the chips 111-113 along the first direction. During this period, it is only possible to use the probe groups 141 and 142 to respectively perform the function test and the HVS test. When the CP test is performed on the second row of chips (114-120), the CP test can be performed on the chips 114-120 along the second direction (as shown by arrows of FIG. 7B). During this period, it is only possible to use the probe groups 141 and 143 to respectively perform the function test and the HVS test. In this manner, it is possible to alleviate the problem in the above embodiment that the CP test can only be performed on each chip in the same direction, and to decrease the moving path of the substrate 133, thereby shortening the CP test time.

To sum up, the present invention uses the first group of probes to perform the HVS test on a chip, and uses the second group of probes to perform the function test on another chip, where the period of the HVS test overlaps the period of the function test, thereby greatly reducing the test time of the wafer. The other advantages are as followed.

1. A plurality of separately operating probe groups is used to flexibly adjust the sequence of performing the HVS test and the function test of each chip, thereby shortening the moving path required by each probe group, and decreasing the time cost by the CP test. In addition, the probe group used to perform the HVS test and the probe group used to perform the function test may not be interfered with each other to cause unnecessary waiting time.

2. In one embodiment, a plurality of probe groups is integrated on the same substrate, such that the wafer test system only needs to control the moving of the substrate to drive the plurality of probe groups to perform the HVS test and the function test, thereby decreasing the hardware cost.

3. In one embodiment, the secondary pads connected in parallel are added to the primary pads on each chip, and the secondary pads are used to perform the CP test, so as to prevent the primary pads from being damaged due to the CP test, thereby greatly improving the chip yield.

4. In one embodiment, the BIST circuit is integrated in the chip, only a small number of basic input signals are required to provide more basic input signals to the core circuit, thereby decreasing the quantity of the probes required by the CP test.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A wafer test system, comprising:
a wafer to be tested, having a plurality of chips; and
a wafer test device, for testing the chips, comprising:
a substrate;
a first group of probes, disposed under the substrate, for performing a high voltage stress (HVS) test on one of the chips; and
a second group of probes, disposed under the substrate and neighboring to the first group of probes in a preset direction, for performing a function test on another one of the chips neighboring to the one of the chips in the preset direction;
wherein a period of the HVS test overlaps a period of the function test.

2. The wafer test system as claimed in claim 1, wherein each of the chips respectively comprises:
a core circuit;
a primary pad, coupled to the core circuit; and a secondary pad, connected in parallel with the primary pad, for providing an electrical connection interface to one of the first group of probes or the second group of probes.

3. The wafer test system as claimed in claim 1, wherein each of the chips respectively comprises:
a core circuit;
a build in self test (BIST) circuit, coupled to the core circuit; and
a plurality of pads, coupled to the BIST circuit;
wherein, by contacting the first group of probes with corresponding ones of the pads, the wafer test system controls the BIST circuit to provide test signals to the core circuit, so as to perform the HVS test.

4. The wafer test system as claimed in claim 3, wherein when the BIST circuit is enabled, the BIST circuit provides a gamma voltage, a data initial pulse, a line latch signal, and a polarity control signal to the core circuit, so as to perform the HVS test.

5. The wafer test system as claimed in claim 3, wherein by contacting the second group of probes with corresponding ones of the pads, the wafer test system controls the BIST circuit to provide test signals to the core circuit, so as to perform the function test.

6. The wafer test system as claimed in claim 5, wherein when the BIST circuit is enabled, the BIST circuit provides a gamma voltage, an input data, a data initial pulse, a line latch line, and a polarity control signal to the core circuit, so as to perform the function test.

7. The wafer test system as claimed in claim 1, wherein the wafer test device further comprises:
   a third group of probes, disposed under the substrate;
   wherein if the wafer test device moves in a first direction to test the chips, the wafer test system performs the HVS test on one of the chips through the first group of probes, and simultaneously performs the function test on another one of the chips through the second group of probes; and
   if the wafer test device moves in a second direction to test the chips, the wafer test system performs the HVS test on one of the chips through the third group of probes, and simultaneously performs the function test on another one of the chips through the second group of probes.

8. The wafer test system as claimed in claim 1, wherein the wafer test device further comprises:
   a fourth group of probes, disposed under the substrate;
   wherein if the wafer test device moves in a first direction to test the chips, the wafer test system simultaneously and respectively performs the HVS test on two of the chips through the fourth group of probes and the first group of probes, and simultaneously performs the function test on another one of the chips through the second group of probes.

9. A wafer test device, for testing a plurality of chips of a wafer, comprising:
   a substrate;
   a first group of probes, disposed under the substrate, for performing a HVS test on one of the chips; and
   a second group of probes, disposed under the substrate, for performing a function test on another one of the chips;
   wherein a period of the HVS test overlaps a period of the function test.

10. The wafer test device as claimed in claim 9, further comprising:
    a third group of probes, disposed under the substrate;
    wherein if the wafer test device moves in a first direction to test the chips, the HVS test is performed on one of the chips through the first group of probes, and the function test is simultaneously performed on another one of the chips through the second group of probes; and
    if the wafer test device moves in a second direction to test the chips, the HVS test is performed on one of the chips through the third group of probes, and the function test is simultaneously performed on another one of the chips through the second group of probes.

11. The wafer test device as claimed in claim 9, further comprising:
    a fourth group of probes, disposed under the substrate;
    wherein if the wafer test device moves in a first direction to test the chips, the HVS test is performed simultaneously and respectively on two of the chips through the fourth group of probes and the first group of probes, and the function test is simultaneously performed on another one of the chips through the second group of probes.

* * * * *